US009279854B2

(12) United States Patent
Johnson et al.

(10) Patent No.: US 9,279,854 B2
(45) Date of Patent: Mar. 8, 2016

(54) MECHANISM FOR FACILITATING MODULAR PROCESSING CELL FRAMEWORK AND APPLICATION FOR ASYNCHRONOUS PARALLEL SINGULATED SEMICONDUCTOR DEVICE HANDLING AND TESTING

(71) Applicants: John C. Johnson, Phoenix, AZ (US); Eric J. Moret, Beaverton, OK (US); Robert W. Edmondson, Hillsboro, OR (US); Todd P. Albertson, Warren, OR (US)

(72) Inventors: John C. Johnson, Phoenix, AZ (US); Eric J. Moret, Beaverton, OK (US); Robert W. Edmondson, Hillsboro, OR (US); Todd P. Albertson, Warren, OR (US)

(73) Assignee: Intel Corporation, Santa Clara, CA (US)

( * ) Notice: Subject to any disclaimer, the term of this patent is extended or adjusted under 35 U.S.C. 154(b) by 424 days.

(21) Appl. No.: 13/729,276

(22) Filed: Dec. 28, 2012

(65) Prior Publication Data

US 2014/0184255 A1 Jul. 3, 2014

(51) Int. Cl.
*G01R 1/00* (2006.01)
*G01R 31/28* (2006.01)

(52) U.S. Cl.
CPC ........ *G01R 31/2893* (2013.01); *G01R 31/2834* (2013.01); *G01R 31/2891* (2013.01); *G01R 31/2894* (2013.01)

(58) Field of Classification Search
CPC .......... G01R 31/2893; G01R 31/2834; G01R 31/2891; G01R 31/2894
USPC ..................................... 324/750.16
See application file for complete search history.

(56) References Cited

U.S. PATENT DOCUMENTS

| 7,397,259 B1* | 7/2008 | Agarwal et al. ......... 324/762.09 |
| 2008/0238460 A1* | 10/2008 | Kress et al. .................. 324/758 |
| 2009/0070784 A1* | 3/2009 | Schmidt ............. G06F 11/3495 |
| | | 719/318 |
| 2013/0007546 A1* | 1/2013 | Grady et al. .................. 714/726 |

OTHER PUBLICATIONS

Micross Components, What is Bare Die?, p. 1-2, Mar. 22, 2015, http://www.micross.com/articles-what-is-bare-die.aspx.*

* cited by examiner

*Primary Examiner* — Thomas F Valone
(74) *Attorney, Agent, or Firm* — Blakely, Sokoloff, Taylor & Zafman LLP

(57) ABSTRACT

A mechanism is described for facilitating and employing a modular processing cell framework according to one embodiment. A method of embodiments may include accepting one or more semiconductor devices in one or more media at a modular processing cell framework ("framework") including a plurality of test cells, moving the one or more semiconductor devices from the one or more media to one or more test cells for testing; and testing the one or more semiconductor devices.

20 Claims, 7 Drawing Sheets

MECHANISM FOR FACILITATING MODULAR PROCESSING CELL FRAMEWORK AND APPLICATION FOR ASYNCHRONOUS PARALLEL SINGULATED SEMICONDUCTOR DEVICE HANDLING AND TESTING

FIELD

The present disclosure generally relates to testing systems, and more particularly, to modular processing cell framework.

BACKGROUND

Semiconductor tests have traditionally been implemented by docking Automatic Test Equipment (ATE) (also referred to as "testers") to material handling equipment. Typically, testers provide electrical stimulation and response capture, while the handling equipment places the units or devices being tested into contactors and provides thermal conditioning. However, these conventional solutions are known for ganging the devices being tested in parallel and introducing a number of compromises. For example, devices being tested are densely packed together and the tooling to electrically connect them is difficult to design, while connections are often limited to less than the numbers desired, etc. Another severe limitation of conventional systems is that the socketing cycle has to wait until the last device under test ("DUT") completes testing. This means that devices that finish testing earlier have to wait idle in the contactor, which significantly reduces the overall utilization of the test equipment.

DETAILED DESCRIPTION

Figure 1:
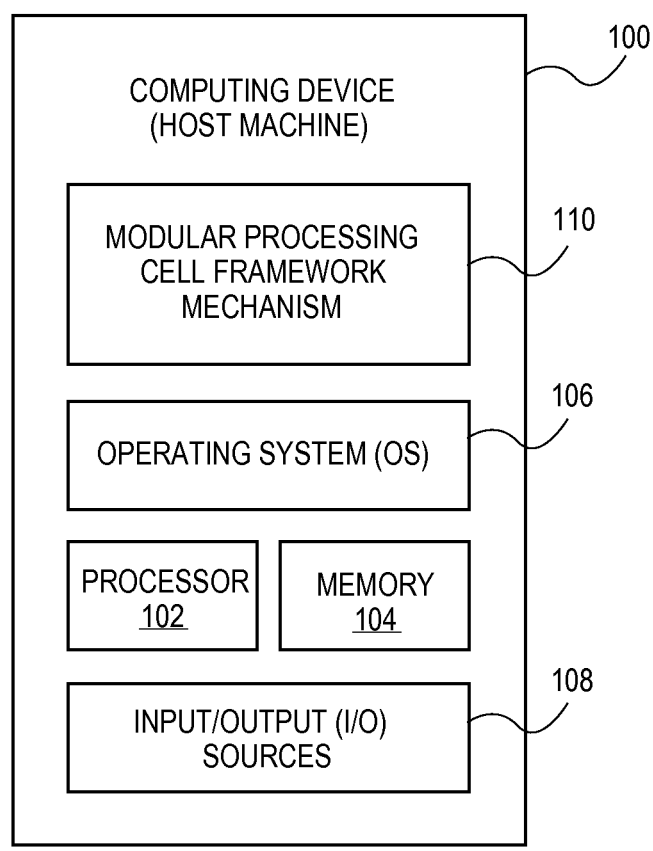
FIG. 1 illustrates a modular processing cell framework employed at a computing device according to one embodiment.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Embodiments facilitate a modular processing cell framework (also referred to as "MPCF", "processing framework", "test cell framework", "system framework", or simply "framework") that provides a generic structure that hosts modular test cells that may have a variety of purposes. However, the use of the terms "modular processing cell framework" or "MPCF", etc., should not be read to limit embodiments to devices that carry that label in products or in literature external to this document.

The framework may be populated with application-specific test cells that adhere to a simple utility interface and may be entirely self-sufficient in executing their targeted test process. Moreover, for example, the first application of the framework may use "singulated die test cells" to test semiconductor die after they have been separated from the wafer form but prior to being packaged. This is a uniquely novel test process and provides a critical solution to "known good die" test strategies. By having a reusable, scalable, test cell framework, and application-specific test cells capable of robustly testing singulated die, embodiments provide for a solution for predicting die performance when packaged with high confidence while maintaining an affordable manufacturing flow.

Embodiments provide for a generic framework for asynchronous parallel singulated semiconductor device (e.g., bare die or packaged die) and materials testing, while the framework may host a variety of application-specific test cells. In one embodiment, the framework may provide a media input/output (I/O) system (also referred to as "I/O system" or "I/O terminal") serving as a subsystem within the system framework, and a media transfer/delivery/transport system (also referred to as "transfer system", "transfer terminal", "delivery system", "delivery terminal", "transport system", or "transport terminal") serving as a subsystem within the system framework to handle a common media form factor that can deliver various semiconductor devices and material types to the test cells of the framework. Further, the framework may host mixed versions of application-specific test cells concurrently, such that all are served by the common media I/O and transport components of the framework, where the application-specific test cells may be fully self-contained and capable of being used standalone or assembled in a matrix or some combination using the media I/O and transport system.

Application-specific test cells that can be tailored to a particular type of test processing application may still be fully compatible in the system framework of mechanical support, utility connections, media delivery, and/or overall processing logic. For example, an application-specific test cell that is aligned to processing a bare semiconductor die for the purposes of applying test content and environment conditions that provide a "known good die" test coverage with short between die index time. Furthermore, in contrast with conventional test solutions, in one embodiment, application test cells of the framework may be removed and replaced while the framework continues to process media and associated devices in other test cells. This novel process can be referred to as "hot swap". In some embodiments, a process business logic scheme may map media container content, media tray content, and adaptively schedule material flow based on current map status. Further, the process business logic scheme may allow media to be dispatched to any destination in the framework from any current location in the framework, such as from I/O containers to test cells, from one test cell to another test cell, and back to being re-processed in the same test cell, etc.

FIG. 1 illustrates a modular processing cell framework 110 employed at a computing device 100 according to one embodiment. Computing device 100 serves as a host machine to employ modular processing cell framework mechanism ("framework mechanism") 110 to offer a configurable, modular, and scalable framework hosting a matrix of fully independent test cells. Computing device 100 may include larger computing devices, such as server computers, desktop computers, etc., and set-top boxes (e.g., Internet-based cable television set-top boxes, etc.). Computing device 100 may also include mobile computing devices, such as cellular phones including smartphones (e.g., iPhone® by Apple®, BlackBerry® by Research in Motion®, etc.), personal digital assistants (PDAs), etc., tablet computers (e.g., iPad® by Apple®, Galaxy 3® by Samsung®, etc.), laptop computers (e.g., notebook, netbook, Ultrabook™, etc.), e-readers (e.g., Kindle® by Amazon®, Nook® by Barnes and Nobles®, etc.), etc.

Computing device 100 includes an operating system (OS) 106 serving as an interface between any hardware or physical resources of the computer device 100 and a user. Computing device 100 further includes one or more processors 102, memory devices 104, network devices, drivers, or the like, as well as input/output (I/O) sources 108, such as touchscreens, touch panels, touch pads, virtual or regular keyboards, virtual or regular mice, etc. It is to be noted that terms like "computing device", "node", "computing node", "client", "host", "server", "memory server", "machine", "device", "computing device", "computer", "computing system", and the like, may be used interchangeably throughout this document.

Figure 2:
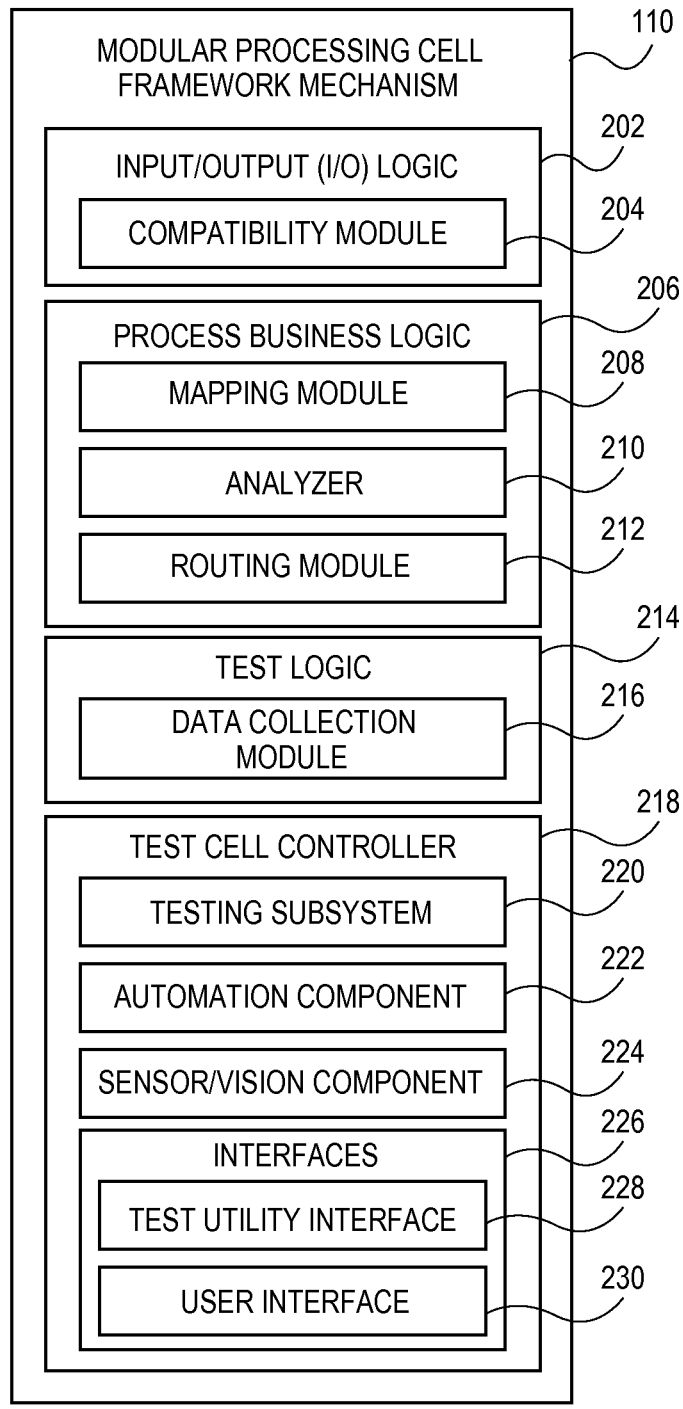
FIG. 2 illustrates a modular processing cell framework mechanism according to one embodiment.

FIG. 2 illustrates a modular processing cell framework mechanism 110 according to one embodiment. In one embodiment, framework mechanism 110 includes a number of components, such as: input/output logic 202 having compatibility module 204; process business logic 206 having mapping module 208, analyzer 210, routing module 212; test logic 214 having data collection module 216; and test cell controller 218 having testing subsystem 220, automation component 222, sensor/vision component 224, and interfaces 226 including test utility interface ("TUI") 228 and user interface ("UI") 230. Throughout this document, the term "logic" may be interchangeably referred to as "component" or "module" and may include, by way of example, software, hardware, and/or any combination of software and hardware, such as firmware. Modular processing cell framework 110 is illustrated in FIG. 2. In one embodiment, framework mechanism 110 may be employed at a computing device (e.g., server computer), such as host machine 100 of FIG. 1, that may be part of or in communication with the system framework. Further, the computing device hosting framework mechanism 110 may be locally situated or remotely in communication with the system framework.

In one embodiment, I/O logic 202 may be used to facilitate the media I/O subsystem to accept any number of DUTs, such as a semiconductor devices presented in, for example, standard media format (e.g., Joint Electron Devices Engineering Council (JEDEC) standard device trays). I/O logic 202 may further include compatibility module 204 to ensure that DUTs of any type, model, age, size, and/or standard, etc., may be accepted for testing and relevant processing at the framework.

Framework mechanism 110, in one embodiment, further includes process business logic ("business logic") 206 to support a flexible routing of the media within the framework. For example, when a container of media arrives at the I/O terminal, a software-based data structure representing a map of the individual media elements (e.g., containers like trays, boxes, etc.) may arrive or be provided or produced with it. These maps and the mapping processes may be handled by mapping module 208 of business logic 206. In one embodiment, mapping module 208 may be used to receive, alter, or produce such maps and provide them to analyzer 210 for analysis to determine, for example, which media within the container is to be processed with what might be relevant routing rules (such as a media in a container may be routed to a different test cell or returned to a previous test cell, etc.). Analyzer 210, using any information or data about routing paths, routing rules, etc., may determine and/or finalize a routing path for each media and provides the analysis to routing module 212 to perform or facilitate performance of routing tasks.

Continuing with the example above, when media arrives at a test cell, the data structure for that specific instance of media may indicate which devices/DUTs are to be processed as well as any relevant process-specific requirements. As the media is distributed, via routing module 212, and the devices are processed, the mapped data structure may be continuously updated using mapping module 208. These updates may occur both internally within the system framework as well as externally. The internal/external update processes may be simple (e.g., "test complete, bin result: xyz") or have a more complex process control system implications (e.g., monitoring test results and applying rules that may dynamically affect the applicable processing instructions, etc.). Thus, for example, while a media tray is being processed within a test cell, an internal (or external) process control system (PCS) system may determine that some devices need to be re-tested within the same cell or be routed (or re-routed) to a different cell for additional testing.

In one embodiment, routing module 212 may directly or indirectly facilitate moving of any number and type of entities from the media to the test processing site, such as devices/DUTs, consumable materials (e.g., cleaning elements), test contactors, thermal conditioning apparatus, etc. In one embodiment, test logic 214 facilitates performance of testing of the DUT using, for example, an ATE, etc., embedded in or integrated within one or more test cells of the system framework. Data collection module 216 may collect the test data resulting from testing of the DUT facilitated by test logic 214 for within-cell flow decisions and/or external analysis and dispositioning. Once the testing of the DUT has concluded, routing module 212 may facilitate moving the device/DUT back to the corresponding media, and further facilitate dispatching the media. It is contemplated that in some embodiments, routing module 212 may adaptively route the media based on internal and external rules-based decisions to include one or more of reprocessing in the same cell, processing further in a different cell, and processing a sample of the device/DUT on the corresponding media using a different test process (or in a different test cell type), etc.

Figure 3:
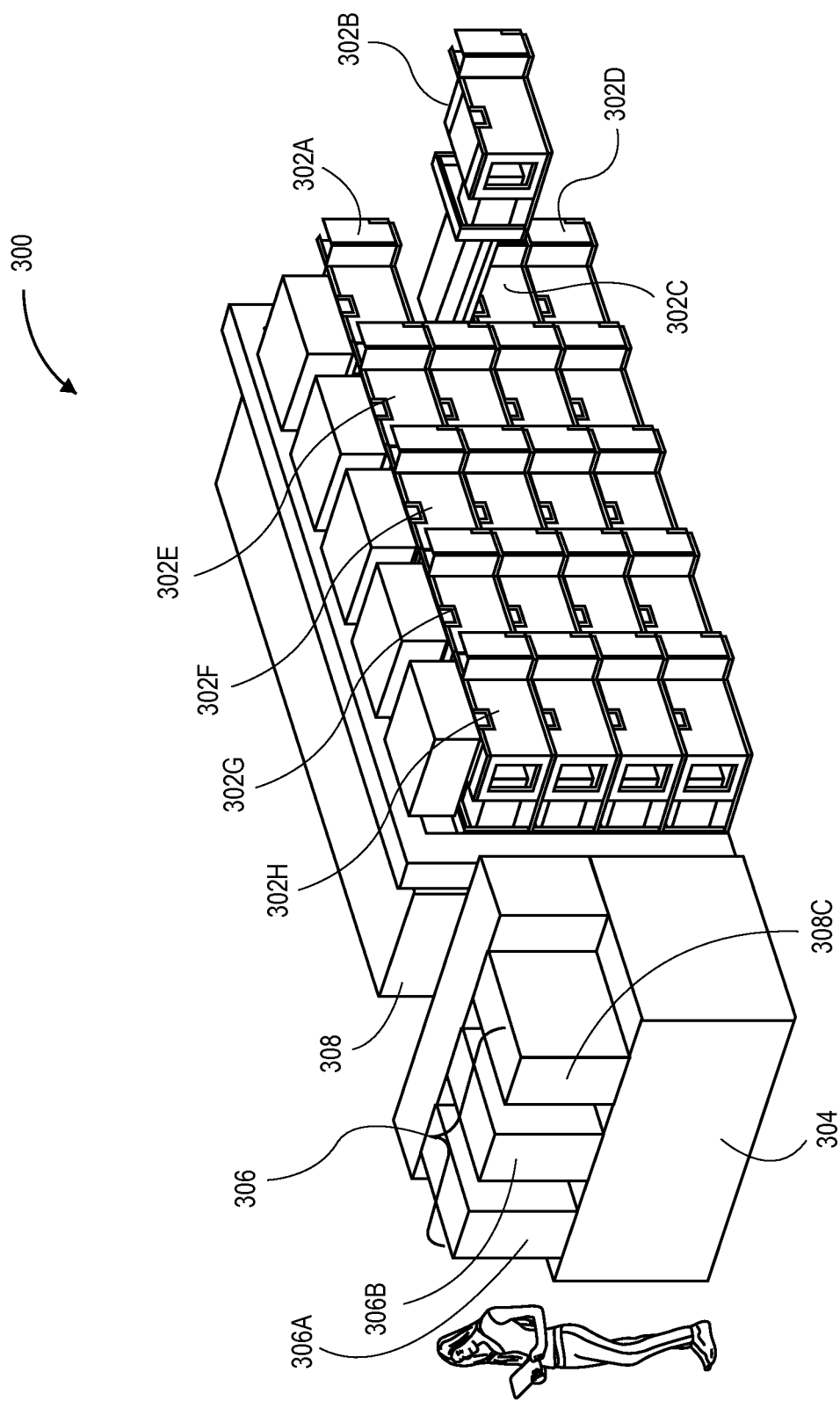
FIG. 3 illustrated a modular processing cell framework according to one embodiment.
Figure 4:
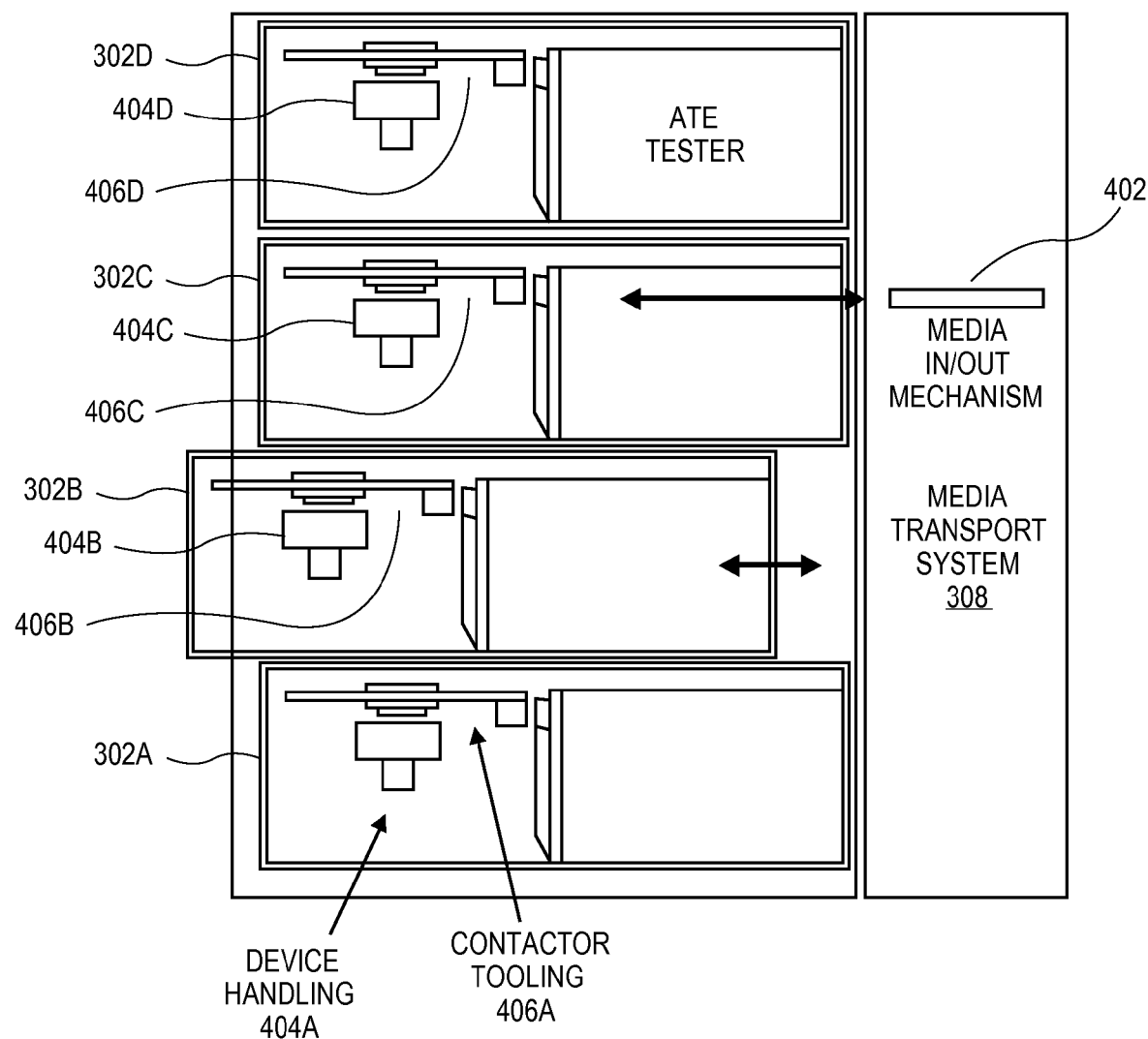
FIG. 4 illustrated a section of the module processing cell framework of FIG. 3 having a test cell stacking with a media transport system according to one embodiment.

Furthermore, at the time a test cell has finished processing the devices/DUTs it receives on media, the media may be routed back to the I/O terminal or send to a different test cell for further test processing of the devices to be DUTs. Once the test processing of devices on the media has been completed, the devices (after being tested as DUTs) are returned to the I/O system and made available to be moved, for example, into other production operations. The media at the I/O system may be managed in any number of ways, such as it may arrive in a bare tray stack form and be singulated (by tray) for distribution within the I/O system. Further, the media may be containerized such that it is already shelved and/or singulated within a standardized container form enabling both simpler I/O functions and the use of automated material handling systems for routing material on a factory floor, such as similar to standardized wafer "front opening unified pod" containers. Test cell stacking with media transport delivery system is illustrated in FIG. 3. Similarly, media transport system and the media and device flows within the media transport system are illustrated in FIG. 4.

In one embodiment, the media form factor may be generic and any device type may be transported on the media without regard to, for example, device-specific handling requirements and that device-specific handling may occur in specific test cell types designed for that purpose. Further, because media may be generic, it may be processed out of standardized containers at the I/O terminal or port. This technique may enable consideration of factory material handling systems for standard container transport. While a container may not be required, a shelved version may avoid excess buffering and/or handling of media in the framework's transport system. Further, media buffering may be limited to within a test cell to, for example, allow a fast exchange of trays when processing completes on one tray and the cell may be ready to begin processing the next tray.

In one embodiment, media and the corresponding devices on the media may be processed in any order and the processing may be directed to subsets of the media/devices by, for example, mapping module 208 of business logic 206. Further, media and devices may be re-processed, by test logic 214, or moved to different test cells for different processes based on dynamic decision making and map updating as facilitated by various components 208-212 of business logic 206. In one embodiment, mapping module 208 may use the available map-based data structures to track various media and device movement within the system framework. For example, data structure may also provide a real-time update of the process history as well as the current status of various media and devices. Analyzer 208 may facilitate any internal and external tools to use data structure as input for rules-based process decision-making. Moreover, test cells may be removed from the framework in a "hot swap" manner, as aforementioned, while the system framework may continue to perform test processing, via test logic 214, on other DUTs as a number of test cells may be removed, replaced, and/or have any necessary maintenance and/or repair operations done on them, offline, to maintain a high system utilization.

While multiple application-specific test cells may be employed in the framework, a specific test cell may be used to test a singulated semiconductor die in such a manner that "known good die" test coverage may be accomplished with lower cost and higher test coverage versus a less capable wafer-level parallel test. In one embodiment, the framework may be used for singulated semiconductor die test because it may resolve any thermal control-related issues associated with the conventional ganged probing of die groups on a wafer, and with the single die handling and focused probe tooling solutions, a robust electrical test environment and other elements (e.g., dynamic thermal control component) may be hosted during the test.

These aforementioned refinements may be used to produce a test coverage result that may be equivalent to the outcome seen after the die has been assembled into a package. Since a die may have been fully processed prior to the singulated die test, the next process may be to mount them in some form of package or direct attachment scheme, where die testing via this test cell and system framework may enable true "known good die" test coverage at a low high-volume manufacturing test cost.

In one embodiment, framework mechanism 110 further includes test cell controller 218 to manage and control any number and type of components, subsystems, etc., relating to various test processing functions of the framework. For example, in one embodiment, test cell controller may manage and control one or more test subsystems 220 (e.g., ATE or any other semiconductor testing system) that may be employed by the framework to perform test processing including various testing functions as facilitated by test logic 214. For example, test subsystem 220 may provide non-electrical test stimulus or response capture, etc., such as light sources/sensors, radio frequency (RF) energy/detectors, accelerators, vibrations generators, etc.

Test cell controller 218 may further manage and control one or more automation components 222 that work with routing module 212 to move various media into test cells and then move devices between the media and other test processing apparatus, etc. Test cell controller 218 may manage and control any number and type of other components, such as a device thermal control component, a tester control component, etc., that may be employ and used to perform test processing. Further, sensor/vision component 224 may be used to provide functions such as visual inspection and precision alignment of DUTs. This may include media and device identification and presence detecting functions for product traceability.

Interfaces 226 may include TUI 228 and UI 230, wherein TUI 228 may be host and/or facilitate the framework to provide utility connections (e.g., power connection, air connection, vacuum connection, coolant connection, communication connection, host control connection, etc.) that may be necessitated or desired for test processor or one or more functions relating to test processing, such as operating a test cell. UI 230 may serve as a user interface for a user to access the framework and its testing mechanism, where the user may include a tester, a test supervisor, a system administrator, etc. UI 230 may further include an electrical interface unit that provides a connection between a DUT and the tester, where the UI 230 may be made specific to a particular test cell and/or test process type. UI 230 may include a common UI, such as a sort interface unit (SIU), a test interface unit (TIU), a probe card, a load board, a device interface board (DIB), a burn in board (BIB), etc.

For example, singulated semiconductor die testing may be performed, including an ATE tester, an SIU with a probe contractor, thermal conditioning via convection chamber and/or conduction surface, fine alignment state for fine pitch probe contacts, etc. Singulated die may be carried on media (such as a pocketed or non-pocketed tray) to test cells for asynchronous parallel processing. Packaged semiconductors device testing may also benefit from framework mechanism 110 facilitating the system framework. For example, a test cell may consist of an ATE tester, a TIU with a contactor, a thermal conditioning via a convection chamber and/or conduction surface, fine alignment mechanisms for fine pitch contacts, etc. Package devices are carried on the media (such as a pocketed JEDEC tray) to the cells for asynchronous parallel processing.

Semiconductor package substrate testing may include an open/short/leakage, etc., tester, a 2-side probe tooling contactor, a fine alignment stage for fine probe contacts, etc. Singulated or paneled substrates may be carried on media (such as a panel or pocketed tray) to the cells for asynchronous parallel processing. Further, packaged semiconductor device (or singulated die) stress testing may include a burn driver, a BIB with contactor, thermal conditioning via a convection chamber, and/or a conduction surface, a fine alignment mechanism for fine pitch contacts, etc. Package devices may be carried on the media (such as a pocketed JEDEC tray) to the cells for asynchronous parallel processing.

It is contemplated that any number and type of components may be added to and/or removed from framework mechanism 110 and/or the modular processing cell framework to facilitate various embodiments including adding, removing, and/or enhancing certain features. For brevity, clarity, and ease of understanding of framework mechanism 110 and the system framework, many of the standard and/or known components, such as those of a computing device, are not shown or discussed here. It is contemplated that embodiments, as described herein, are not limited to any particular technology, topology, system, architecture, and/or standard and are dynamic enough to adopt and adapt to any future changes.

FIG. 3 illustrated a modular processing cell framework 300 according to one embodiment. It is to be noted that for the sake of brevity, clarity, and ease of understanding, the workings of framework 300 and its various components (such as test cells 302, etc.) previously discussed with reference to framework mechanism 110 in FIG. 2 are not described or repeated here. In the illustrated embodiment, framework 300 is shown to have stack of twenty test cells 302, such as test cell 302A, 302B, 302C, 302D, 302E, 302F, 302G and 302H. Further, for example, test cell 302B is shown to be pulled out of its compartment or resting space to be used for, for example, device testing or simply for removal of the test cell itself, etc. The left stage area 304 of framework 300 is shown to hold I/O system 306 having I/O boxes or trays 306A, 306B and 306C. Similarly, the back stage of framework 300 holds media transport system 308 having media containers or trays. It is contemplated that the illustrated framework 300 is merely shown and discussed as an example for brevity and ease of understanding, but that embodiments of modular processing cell framework 300 are not limited to the number and/or type of components, features, and/or functionalities, etc., illustrated here or described throughout this document.

FIG. 4 illustrated a section of the module processing cell framework 300 of FIG. 3 having a test cell stacking with a media transport system 308 according to one embodiment. It is to be noted that for the sake of brevity, clarity, and ease of understanding, the workings of framework 300 and its various components (such as test cells 302, etc.) previously discussed with reference to framework mechanism 110 in FIG. 2 are not described or repeated here. The illustrated embodiment shows media transport system 308 having media I/O mechanism 402 and further having attached to a number of stacked test cells, such test cells 302A, 302B, 302C and 302D, where test cell 302B is shown as being pulled out of its compartment or resting space. In one embodiment, media I/O mechanism 402 may be used to insert or eject the media which may then be received at an ATE tester, such as ATE tester 408C of test cell 302C. As illustrated and in one embodiment, each test cell 302A, 302B, 302C and 302D includes ATE tester 408A, 408B, 408C and 408D, device handling component 404A, 404B, 404C and 404D, and contactor tooling component 406A, 406B, 406C and 406D.

In one embodiment, once connected to proper utilities and a host controller, any of the self-contained test cells 302A, 302B, 302C and 302D may have the ability to execute its specific test processes. By design and using framework mechanism 110 of FIG. 1, for example, each test cell 302A, 302B, 302C and 302D may deliver identical process results, regardless of the configuration of the host system framework 300 of FIG. 3. For example, any single of test cells 302A, 302B, 302C and 302D may perform the same way by itself or within system framework 300 even with, for example, framework 300 having employed tens or even hundreds of such test cells.

Figure 5:
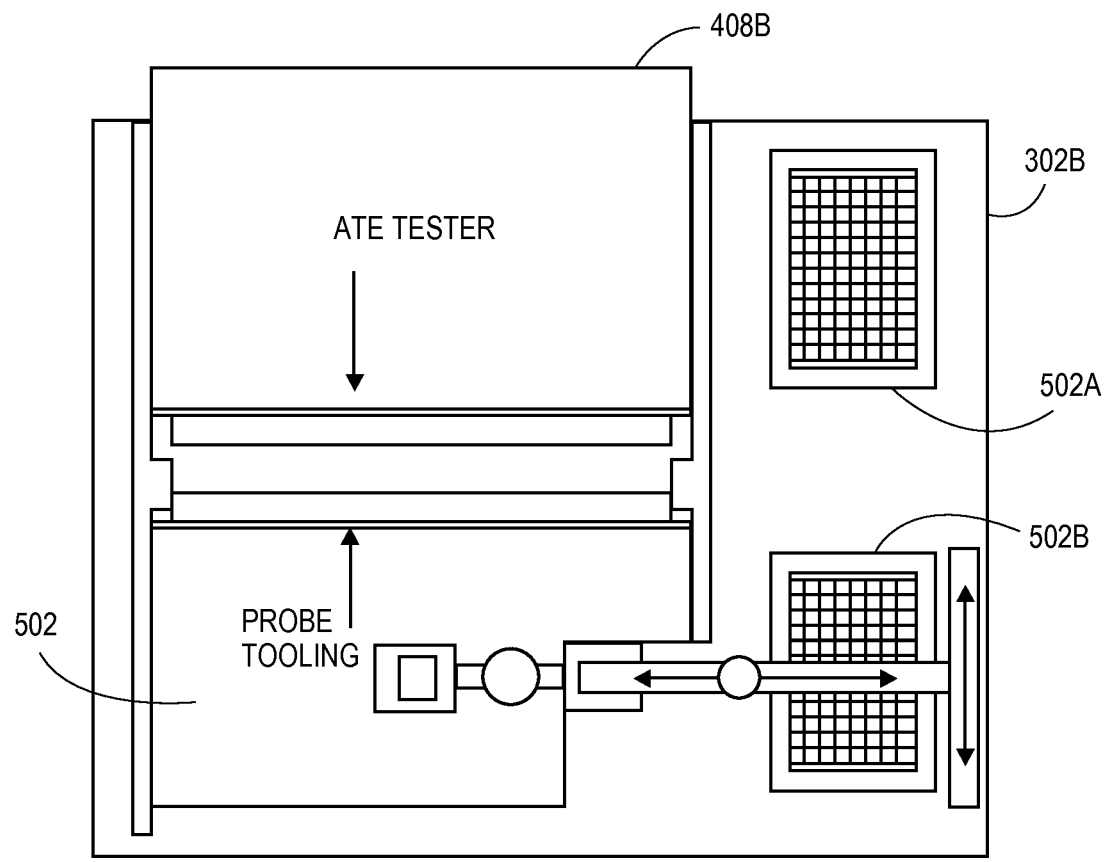
FIG. 5 illustrates an embodiment of a singulated die test cell according to one embodiment.

FIG. 5 illustrates an embodiment of a singulated die test cell 302A according to one embodiment. In the illustrated embodiment, test cell 302A represents a test cell that may be used for testing of singulated semiconductor die in such a fashion that "known good die" test coverage may be achieved that is cost-efficient and high quality that allows for a high throughput without the problems typically associated with the conventional ganged probing of die groups on a wafer. In the illustrated embodiment, ATE tester 408A and probe tooling component 502 are added to be part of test cell 302A to be used for the singulated semiconductor die testing as described in detail with respect to FIG. 2. For example, with the single die handling capability, facilitated by ATE 408A, and focused probe tooling solutions, via probe tooling component 502, a robust and dynamic electrical test environment, hosting a variety of testing elements (e.g., a cooling component for dynamic thermal cooling during test), may be achieved.

Figure 6:
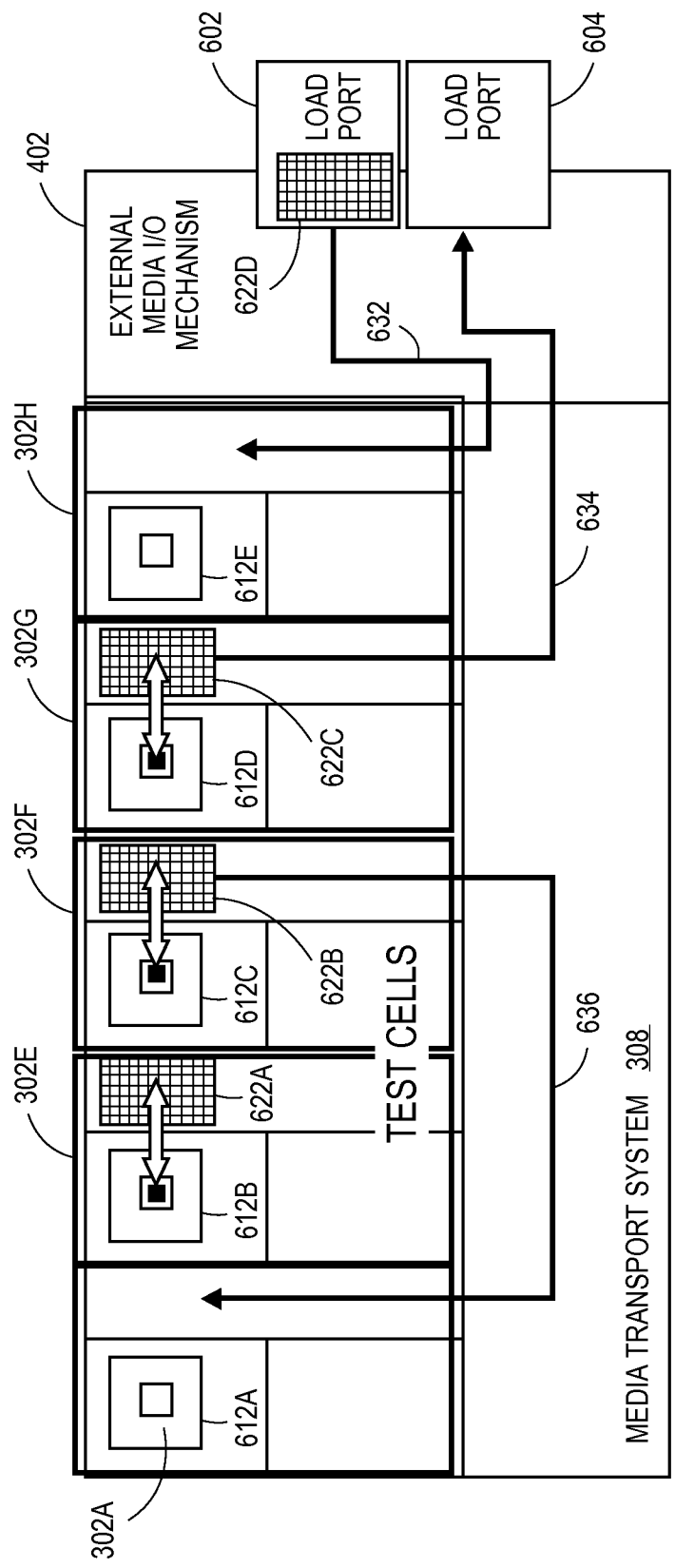
FIG. 6 illustrates a top view of a section of the modular processing cell framework of FIG. 3 according to one embodiment.

FIG. 6 illustrates a top view of a section of the modular processing cell framework 300 of FIG. 3 according to one embodiment. It is to be noted that for the sake of brevity, clarity, and ease of understanding, the workings of framework 300 and its various components previously discussed with reference to framework mechanism 110 in FIG. 2 are not described or repeated here. The illustrated embodiment displays a media and device flow within a section of framework 300 of FIG. 3, such as various media and device flow activities being performed with respect to test cells 302A, 302E, 302F, 302G and 302H.

In the illustrated embodiment, media transport 308 and its external I/O terminal 402 (to perform in/loading/inserting and out/unloading/ejecting of media) are shown, while each test cell 302A, 302E, 302F, 302G and 302H is shown to contain media 612A, 612B, 612C, 612D and 612E. Media 612B-612D are shown to be active or in use as their test cells 612B-612D contain devices 622A-622C that are being tested (e.g., DUTs). It has been described with reference to various components, particularly business logic 206, of framework mechanism 110 in FIG. 2 that media and their content may be used to perform various test-related tasks, such as routing of a device with the system framework. In contrast, media 612A and 612E appear inactive or not in use and their test cells 302A and 302H do not contain any DUTs.

In one embodiment, the testing arrangement may be changed (e.g., using the aforementioned business logic 206 of framework mechanism 110 as described in FIG. 2), such as device 622D is being loaded 632 into test cell 302H via load port 602 of I/O system 306 of FIG. 3, while device 622C is shown to be in the process of being removed 634 from test cell 302G via load port 604. In another embodiment, device 622B of test cell 302F is being re-routed or transferred to test cell 302A for further testing.

Figure 7:
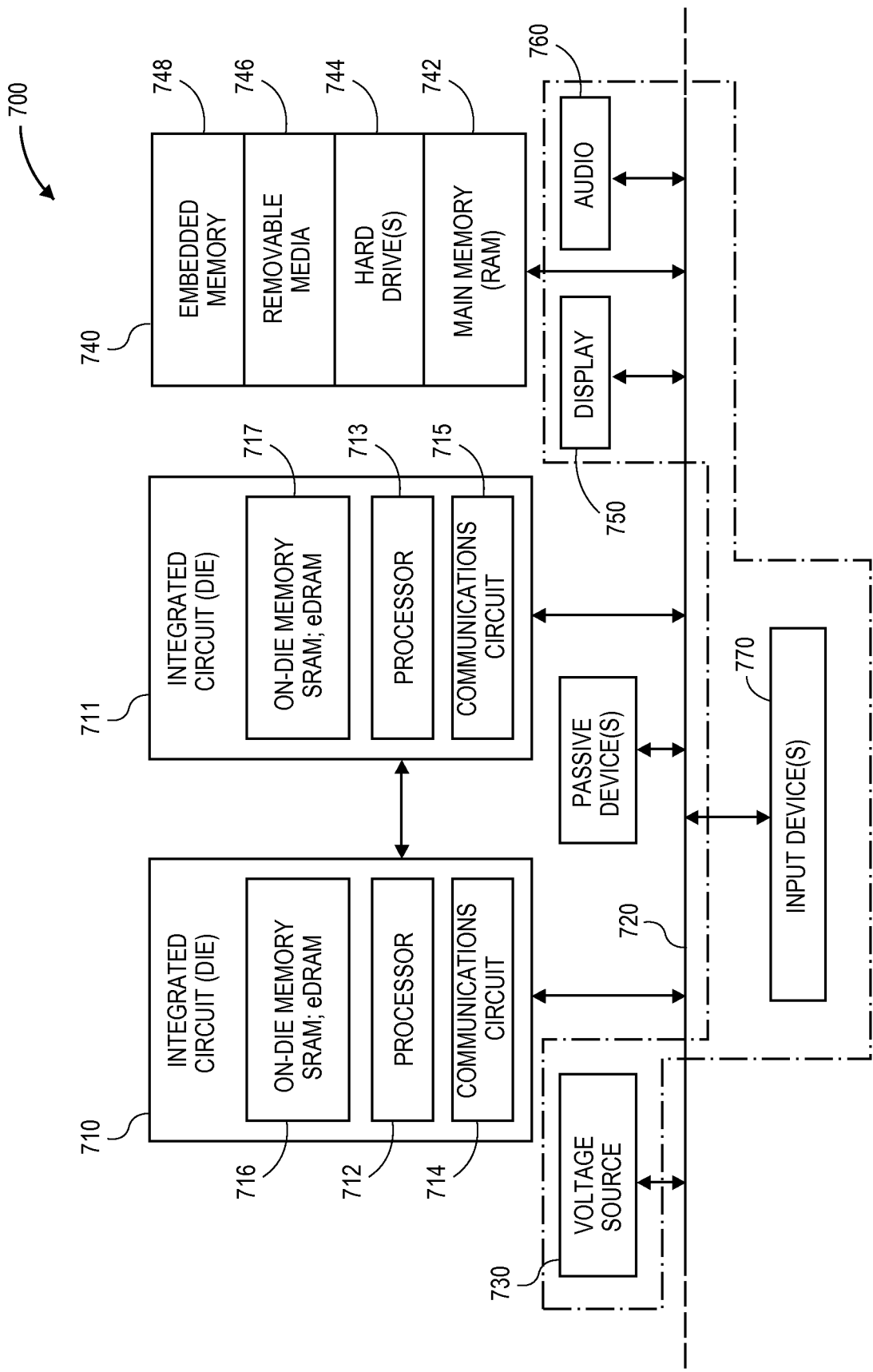
FIG. 7 illustrates one embodiment of a computer system.

FIG. 7 illustrates one embodiment of a computer system 700. The computer system 700 (also referred to as the electronic system 700) as depicted can embody computing device 100 and employ modular processing cell framework mechanism 110 of FIG. 1. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes a thermal controller having a thermal control interface to receive test data from an automated test equipment (ATE) system and dynamically adjust a target setpoint temperature based on the data and a dynamic thermal controller to receive the target setpoint temperature from the thermal control interface and control a thermal actuator based on the target setpoint temperature as disclosed herein.

In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in an embedded TSV die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a test system that includes a dynamic electro-mechanical interconnect having a cavity for separating, via the cavity, a first conductor of an interconnect from a second conductor of the interconnect, and isolating, via the cavity serving as a buffer, a first electrical path provided through the first conductor from a second electrical path provided through the second conductor. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 7. Passive devices may also be included, as is also depicted in FIG. 7.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Some embodiments pertain to a method comprising: accepting one or more semiconductor devices in one or more media at a modular processing cell framework ("framework"), wherein the framework includes a plurality of test cells; moving the one or more semiconductor devices from the one or more media to one or more test cells for testing; and testing the one or more semiconductor devices.

Embodiments or examples include any of the above methods further comprising moving the one or more devices from the one or more test cells back to the one or more media after the testing of the one or more devices has concluded, wherein the one or more test cells include one or more application-specific test cells.

Embodiments or examples include any of the above methods further comprising adaptively routing the one or more media to another set of test cells for different testing, wherein adaptive routing is based on internal and/or external rules-based decisions.

Embodiments or examples include any of the above methods further comprising collecting data relating to the testing to perform one or more of in-testing decisions, external analysis, and dispositioning.

Embodiments or examples include any of the above methods wherein the one or more devices comprise one or more asynchronous parallel singulated semiconductor devices including bare dies or packaged dies.

Embodiments or examples include any of the above methods wherein adaptive routing is based on current mapping status, wherein the current mapping status is further used to dispatch media container content or media tray content.

In another embodiment or example, an apparatus comprises: a plurality of test cells at a modular processing cell framework ("framework"); a first logic to accept the one or more semiconductor devices in one or more media; a second logic to move the one or more semiconductor devices from the one or more media to one or more test cells for testing; and a third logic to test the one or more semiconductor devices.

Embodiments or examples include the apparatus above wherein the second logic is further to move the one or more devices from the one or more test cells back to the one or more media after the testing of the one or more devices has concluded, wherein the one or more test cells include one or more application-specific test cells.

Embodiments or examples include the apparatus above wherein the second logic is further to adaptively route the one or more media to another set of test cells for different testing, wherein adaptive routing is based on internal and/or external rules-based decisions.

Embodiments or examples include the apparatus above further comprising a fourth logic to collect data relating to the testing to perform one or more of in-testing decisions, external analysis, and dispositioning.

Embodiments or examples include the apparatus above wherein the one or more devices comprise one or more asynchronous parallel singulated semiconductor devices including bare dies or packaged dies.

Embodiments or examples include the apparatus above wherein adaptive routing is based on current mapping status, wherein the current mapping status is further used to dispatch media container content or media tray content.

In another embodiment or example, a system comprises: a modular processing cell framework ("framework") having a plurality of test cells; and a computing system coupled to the framework, the computing system having a mechanism to accept the one or more semiconductor devices in one or more media, move the one or more semiconductor devices from the one or more media to one or more test cells for testing, and test the one or more semiconductor devices.

Embodiments or examples include the system above wherein the mechanism is further to move the one or more devices from the one or more test cells back to the one or more media after the testing of the one or more devices has concluded, wherein the one or more test cells include one or more application-specific test cells.

Embodiments or examples include the system above wherein the mechanism is further to adaptively route the one or more media to another set of test cells for different testing, wherein adaptive routing is based on internal and/or external rules-based decisions.

Embodiments or examples include the system above wherein the mechanism is further to collect data relating to the testing to perform one or more of in-testing decisions, external analysis, and dispositioning.

Embodiments or examples include the system above wherein the one or more devices comprise one or more asynchronous parallel singulated semiconductor devices including bare dies or packaged dies.

Embodiments or examples include the system above wherein adaptive routing is based on current mapping status, wherein the current mapping status is further used to dispatch media container content or media tray content.

Another embodiment or example includes an apparatus performing any of the methods in the examples above In another embodiment or example, an apparatus comprises means for performing any one or more of the operations mentioned above.

In yet another embodiment or example, at least one machine-readable medium comprising a plurality of instructions that in response to being executed on a computing device, causes the computing device to carry out a method according to any one or more of the operations mentioned above.

In yet another embodiment or example, at least one non-transitory or tangible machine-readable comprising a plurality of instructions that in response to being executed on a computing device, causes the computing device to carry out a method according to any one or more of the operations mentioned above.

In yet another embodiment or example, a computing device arranged to perform a method according to any one or more of the operations mentioned above.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. An apparatus comprising:
   a plurality of test cells at a modular processing cell framework ("framework");
   input/output (I/O) logic to accept the one or more semiconductor devices in one or more media;
   routing module of process business logic to route, based on a mapping structure, the one or more semiconductor devices from the one or more media to one or more test cells for testing, wherein mapping module of the process business logic to prepare the mapping structure to offer a routing path to map the one or more media to the one or more test cells such that the one or more media are identified and obtained from one or more containers and mapped to be processed by the one or more test cells based on one or more testing rules; and
   test logic to test the one or more semiconductor devices.

2. The apparatus of claim 1, wherein the routing module is further to route the one or more devices from the one or more test cells back to the one or more media after the testing of the one or more devices has concluded, wherein the one or more test cells include one or more application-specific test cells.

3. The apparatus of claim 1, wherein the routing module is further to adaptively route the one or more media to another set of test cells for another testing, wherein adaptive routing is based on at least one of internal rules-based decisions and external rules-based decisions.

4. The apparatus of claim 3, wherein adaptive routing is based on current mapping status as provided by the mapping structure, wherein the current mapping status is further used to dispatch media container content or media tray content.

5. The apparatus of claim 1, further comprising data collection module of the test logic to collect data relating to the testing to perform one or more of in-testing decisions, external analysis, and dispositioning.

6. The apparatus of claim 1, wherein the one or more devices comprise one or more asynchronous parallel singulated semiconductor devices including bare dies or packaged dies.

7. The system of claim 1, wherein the mechanism is further to route the one or more devices from the one or more test cells back to the one or more media after the testing of the one or more devices has concluded, wherein the one or more test cells include one or more application-specific test cells.

8. The system of claim 1, wherein the mechanism is further to adaptively route the one or more media to another set of test cells for another testing, wherein adaptive routing is based on at least one of internal rules-based decisions and external rules-based decisions.

9. The system of claim 8, wherein adaptive routing is based on current mapping status as provided by the mapping structure, wherein the current mapping status is further used to dispatch media container content or media tray content.

10. The system of claim 1, wherein the mechanism is further to collect data relating to the testing to perform one or more of in-testing decisions, external analysis, and dispositioning.

11. The system of claim 1, wherein the one or more devices comprise one or more asynchronous parallel singulated semiconductor devices including bare dies or packaged dies.

12. The apparatus of claim 1, wherein the process business logic comprises analyzer to analyze each of the one or more media and the one or more test cells to determine which of the one or more media is tested by which of the one or more test cells,
 wherein test logic is communicatively coupled to test cell controller having
 testing subsystem to perform test processing including one or more test functions as facilitated by the test logic,
 automation component, in communication with the routing module, to route the one or more media into the one or more test cells and further to route the one or more semiconductor devices between the one or more media and other testing apparatus, and
 sensor/vision component to provide one or more functions to facilitate visual inspection and precision alignment of the framework, wherein the visual inspection and precision alignment further includes determining identification of the one or more media and detecting one or more functions for product traceability.

13. The system of claim 1, wherein the mechanism is further to analyze each of the one or more media and the one or more test cells to determine which of the one or more media is tested by which of the one or more test cells,
 wherein the mechanism is further to
 perform test processing including one or more test functions as facilitated by the test logic,
 route the one or more media into the one or more test cells and further to route the one or more semiconductor devices between the one or more media and other testing apparatus, and
 provide one or more functions to facilitate visual inspection and precision alignment of the framework, wherein the visual inspection and precision alignment further includes determining identification of the one or more media and detecting one or more functions for product traceability.

14. A system comprising:
 a modular processing cell framework ("framework") having a plurality of test cells; and
 a computing system coupled to the framework, the computing system having a mechanism to
 accept the one or more semiconductor devices in one or more media,
 route, based on a mapping structure, the one or more semiconductor devices from the one or more media to one or more test cells for testing, wherein mapping module of the process business logic to prepare the mapping structure to offer a routing path to map the one or more media to the one or more test cells such that the one or more media are identified and obtained from one or more containers and mapped to be processed by the one or more test cells based on one or more testing rules, and
 test the one or more semiconductor devices.

15. A method comprising:
 accepting one or more semiconductor devices in one or more media at a modular processing cell framework ("framework"), wherein the framework includes a plurality of test cells;
 routing, based on a mapping structure, the one or more semiconductor devices from the one or more media to one or more test cells for testing, wherein mapping module of the process business logic to prepare the mapping structure to offer a routing path to map the one or more media to the one or more test cells such that the one or more media are identified and obtained from one or more containers and mapped to be processed by the one or more test cells based on one or more testing rules; and
 testing the one or more semiconductor devices.

16. The method of claim 15, further comprising routing the one or more devices from the one or more test cells back to the one or more media after the testing of the one or more devices has concluded, wherein the one or more test cells include one or more application-specific test cells.

17. The method of claim 15, further comprising adaptively routing the one or more media to another set of test cells for another testing, wherein adaptive routing is based on at least one of internal rules-based decisions and external rules-based decisions.

18. The method of claim 17, wherein adaptive routing is based on current mapping status as provided by the mapping structure, wherein the current mapping status is further used to dispatch media container content or media tray content,
 wherein the method further comprises
 analyzing each of the one or more media and the one or more test cells to determine which of the one or more media is tested by which of the one or more test cells,
 performing test processing including one or more test functions as facilitated by the test logic,
 routing the one or more media into the one or more test cells and further to route the one or more semiconductor devices between the one or more media and other testing apparatus, and
 providing one or more functions to facilitate visual inspection and precision alignment of the framework, wherein the visual inspection and precision alignment further includes determining identification of the one or more media and detecting one or more functions for product traceability.

19. The method of claim 15, further comprising collecting data relating to the testing to perform one or more of in-testing decisions, external analysis, and dispositioning.

20. The method of claim 15, wherein the one or more devices comprise one or more asynchronous parallel singulated semiconductor devices including bare dies or packaged dies.

* * * * *

UNITED STATES PATENT AND TRADEMARK OFFICE
CERTIFICATE OF CORRECTION

PATENT NO. : 9,279,854 B2  
APPLICATION NO. : 13/729276  
DATED : March 8, 2016  
INVENTOR(S) : Johnson et al.

Page 1 of 1

It is certified that error appears in the above-identified patent and that said Letters Patent is hereby corrected as shown below:

On the title page

Item (71) Applicants: delete "Eric J. Moret, Beaverton, OK (US);", insert -- Eric J. Moret, Beaverton, OR (US); --.

Item (72) Inventors: delete "Eric J. Moret, Beaverton, OK (US);", insert -- Eric J. Moret, Beaverton, OR (US); --.

Signed and Sealed this  
Twenty-third Day of August, 2016

Michelle K. Lee  
*Director of the United States Patent and Trademark Office*